United States Patent
Leu et al.

[11] Patent Number: 5,976,636
[45] Date of Patent: Nov. 2, 1999

[54] MAGNETIC APPARATUS FOR ARC ION PLATING

[75] Inventors: Ming-Sheng Leu, Hsinchu Hsien; Wei-Cheng Lih, Tainan; Yuh-Wen Lee, Kaohsiang Hsien; Shau-Yi Chen; Wei-Jieh Chang, both of Yun-Lin Hsien; Shinn-Cherng Huang, Tainan Hsien; Mau-Shen Liou, Hsinchu, all of Taiwan

[73] Assignee: Industrial Technology Research Institute, Hsinchu, Taiwan

[21] Appl. No.: 09/045,103

[22] Filed: Mar. 19, 1998

[51] Int. Cl.[6] .......................... C23C 14/14; C23C 14/00; H05H 1/50
[52] U.S. Cl. .......................... 427/531; 427/566; 427/580; 204/192.38; 204/298.41
[58] Field of Search .................... 427/531, 566, 427/567, 580, 585; 204/192.38, 298.41

[56] References Cited

U.S. PATENT DOCUMENTS

| | | | |
|---|---|---|---|
| Re. 34,806 | 12/1994 | Cann | 427/580 |
| 3,793,179 | 2/1974 | Sablev et al. | 204/298 |
| 4,634,600 | 1/1987 | Shemizu | 427/531 |
| 4,929,321 | 5/1990 | Buhl | 427/580 |
| 5,078,848 | 1/1992 | Anttila et al. | 204/192.38 |
| 5,168,197 | 12/1992 | Tamba et al. | 204/298.41 |
| 5,279,723 | 1/1994 | Falabella et al. | 427/580 |
| 5,282,944 | 2/1994 | Sanders et al. | 204/192.38 |
| 5,298,136 | 3/1994 | Ramalingam | 204/192.38 |
| 5,433,836 | 7/1995 | Martin et al. | 204/192.38 |
| 5,435,900 | 7/1995 | Gorokhausky | 204/298.41 |
| 5,476,691 | 12/1995 | Komvopoulos et al. | 427/531 |
| 5,580,429 | 12/1996 | Chan et al. | 427/580 |

OTHER PUBLICATIONS

Webster's 9th New Collegiate Dictionary, excerpts p. 947 & 405, 1990 no month.

*Primary Examiner*—Marianne Padgett
*Attorney, Agent, or Firm*—W. Wayne Liauh

[57] ABSTRACT

An electric arc ion plating apparatus to coat a metal material on an object includes: (a) an vacuum chamber; (b) an electric arc bombardment chamber in the vacuum chamber, comprising an anode, a cathode target, and an arc triggering electrode to generate metal particles when a voltage is applied on the anode and the cathode, and on the arc triggering electrode; and (c) a magnetic coil having a longitudinal axis. The magnetic coil emanates from the electric arc bombardment chamber and encloses at least a part of the electric bombardment chamber. The magnetic coil contains a constant-diameter section enclosing and immediately emanating from the electric arc bombardment chamber to guide the metal particles away from the cathode and toward the object, and a varying-diameter section away from the electric arc bombardment chamber to provide optimum distribution of the metal particles before they reach the object surface. The varying-diameter section can be a diverging section for effectively coating relatively large objects, or a converging section for efficiently coating a relatively small object.

9 Claims, 3 Drawing Sheets

MAGNETIC APPARATUS FOR ARC ION PLATING

FIELD OF THE INVENTION

The present invention relates to an improved apparatus for arc ion plating. More specifically, the present invention relates to an improved arc ion plating apparatus which includes a novel magnetic tunnel for optimum movement and distribution of the metal ions so as to improve the vacuum plating efficiency without substantially increasing the complexity of the arc ion plating apparatus, nor the cost thereof.

BACKGROUND OF THE INVENTION

Arc ion plating is a well-known technique which achieves its plating purpose through the deposition of metal particles evaporated by an electric arc in a vacuum. The electric arc is characterized by the formation of a cathode spot on the cathode surface, which contains the metal to be vaporized and deposited on an object or a part. In the arc ion plating terminology, the cathode surface is called a "target". An electric voltage above a threshold is required to sustain the electric arc between the anode and the cathode. During the arc ion plating process, the temperature at the cathode spot is approximately equal to the boiling point temperature of the depositing metal so as to allow substantial vapor pressure to be developed for the depositing metal which forms the cathode surface. The vapors produced from the cathode spots are then used to coat objects placed within the vacuum chamber and to sustain the arc ignited between the cathode and the anode. An inert ionizable gas can be introduced into the vacuum chamber to, in conjunction with the use of a triggering electrode, improve the generation as well as stabilizing of the electric arc. Likewise, a reactive gas can be introduced in the vacuum chamber to cause the precipitation of desired compound on the surface of the object being electric arc plated.

As the arc ion plating technique gets fine-tuned, several problems have surfaced. One of the most noticeable problems is the existence of macro particles, which, after they are deposited on the object, often cause the formation of locally roughened film surface. Such a roughened film surface not only projects a defective appearance, more importantly, it can also result in degradations in the mechanical properties of the finished product. For example, the product with roughened film surface tends to crack more easily.

U.S. Pat. No. 3,793,179, which discloses an apparatus for metal evaporation coating, taught many of the fundamental principle of the arc ion plating technique. The content thereof is incorporated herein by reference.

Several other subsequent prior art references have discussed modifications to improve the arc ion plating technology. For example, U.S. Pat. No. 4,673,477, the content thereof is incorporated herein by reference, discloses an apparatus for vacuum arc deposition of material on a surface of an object using a vacuum chamber accommodating the active surface of the cathode and an anode, wherein a power supply is connected to the anode and the cathode to establish an electric arc. The track of the arc is controlled with a magnetic field established with a permanent magnet that is moved in a closed path relative to the cathode.

U.S. Pat. No. 5,298,136, the content thereof is incorporated herein by reference, discloses an apparatus for controlled arc coating of substrates utilizing relatively thick cathodes (i.e., targets). The thick targets are capable of use by controlling and steering the arc in a desired path to produce coatings of the desired compositions using magnetic fields generated to provide arc path control and modulation for efficient cathode utilization.

The above-mentioned prior art references involved improvements in an efficient generation of the vaporized metal ions from the target (i.e., the cathode) surface by controlling the formation of and the disposition of the electric arc. At the present time, the metal particle generating component, i.e., the cathode-anode component, of the arc ion plating apparatus cannot effectively accommodate a very large object. The exit of the art ion generating chamber must be comparable in dimension with respect to the object so as to minimize inhomogeneity between the center and the two ends of the object. On the other hand, for a relatively small object, the metal particle generating component with a fixed dimension may at times cause unnecessary waste and result in loss in efficiency. Furthermore, while the prior art references discussed options to minimize the occurrence of macro particles, they involve relatively complicated design and may not be cost-effective.

SUMMARY OF THE INVENTION

The primary object of the present invention is to develop an improved arc ion plating apparatus. More specifically, the primary object of the present invention is to develop an arc ion plating apparatus with improved distribution of the metal particles after they are generated by the electric arc which is formed by the supply of a voltage between an anode and a cathode, or target, via an arc triggering member, which typically is an arc triggering electrode.

In the present invention, a novel magnetic coil is provided which serves as a tunnel or conduit for optimum distribution of the metal particles after they are generated from a conventional arc bombardment chamber. The arc bombardment chamber typically comprises an anode, a cathode, and an arc triggering electrode. The magnetic coil disclosed in the present invention comprises a uniform diameter section encompassing and immediately away from the arc bombardment chamber, and a diverging or converging section after the uniform-diameter section. The uniform-diameter section guides the metal particles away from the bombardment chamber. The uniform-diameter should have enough length so as to exhibit a filtering effect to prevent the macro particles to reach and deposit on the object. Such a length is specific to the dimension of the arc ion plating apparatus, the type of metal particles involved, the operating condition of the bombardment chamber, etc. A diverging section allows the arc ion plating apparatus to be more effectively coating a relatively large object. On the other hand, a converging section allows the arc ion plating apparatus to be more efficiently coating a small object.

Preferably, the converging or diverging section has an angle of between about 15 and about 75 degrees from the longitudinal axis. The magnetic field can be a DC-based magnetic field or an AC-based magnetic field, and the magnetic field should preferably have a magnetic strength of between about 10 Gauss and 1,500 Gauss.

The present invention can be implemented according to a number of options. For example, the uniform-diameter section and the converging or diverging section of the magnetic coil can be integrated. Or they can be made as separate coils that are connected together during use. Furthermore, the end portion can comprise a pair of diverging-then-converging or converging-then-diverging sections, or a series of alternating diverging and converging sections. The advantage of having such a series of diverging then converging sections is to cause a turbulence in the flow of the metal ions so as to provide a more even distribution, as well as to further filter out the macro particles.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved arc ion plating apparatus with improved distribution of the metal particles after they are generated by the electric arc. The electric arc is formed by the supply of a voltage between an anode and a cathode, or target, and is triggered by an arc triggering electrode in the presence of a plasma gas.

As described above, one of the key features of the present invention is the use a channel-forming novel magnetic coil to provide optimum distribution of the metal particles after they are generated from a conventional arc bombardment chamber, which comprises the target, the anode, and the arc triggering electrode. The magnetic coil disclosed in the present invention comprises a uniform-diameter section encompassing and immediately away from the arc bombardment chamber, and a diverging or converging section after the uniform-diameter section. The uniform-diameter section guides the metal particles away from the bombardment chamber. The uniform-diameter should have enough length so as to exhibit a filtering effect to prevent the macro particles to reach the object. The length of the uniform section should be designed which best suits the specific dimension of the arc ion plating apparatus, the type of metal particles involved, the operating condition of the bombardment chamber, etc. A diverging section allows the arc ion plating apparatus to be more effectively coating a large object. On the other hand, a converging section allows the arc ion plating apparatus to be more efficiently coating a small object.

Figure 1A:
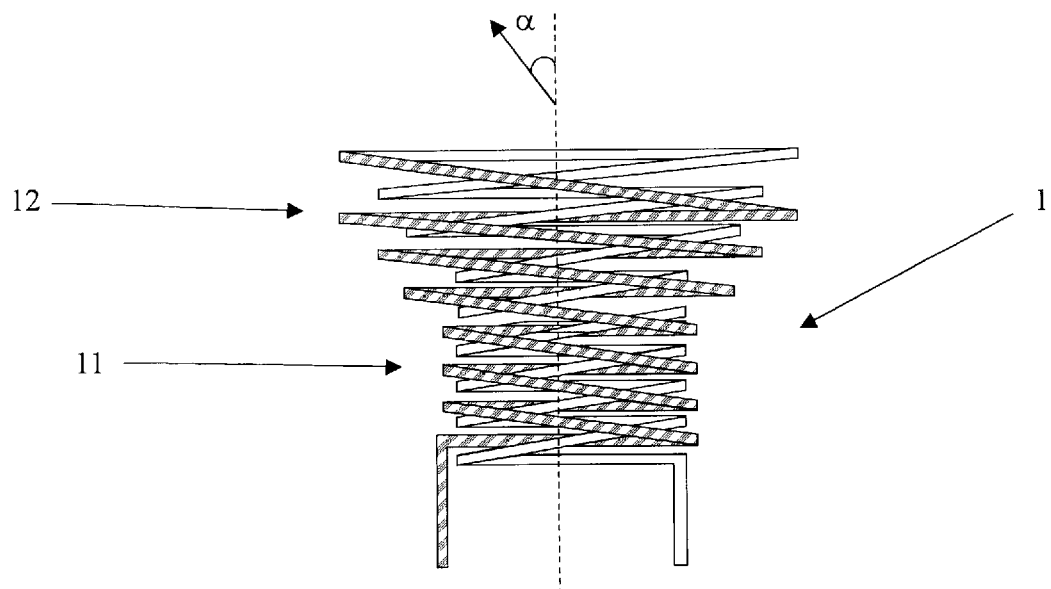
FIG. 1A is a schematic drawing showing a first preferred embodiment of the magnetic coil for use in the arc ion plating apparatus of present invention which includes a uniform-diameter section and a diverging section.
Figure 1B:
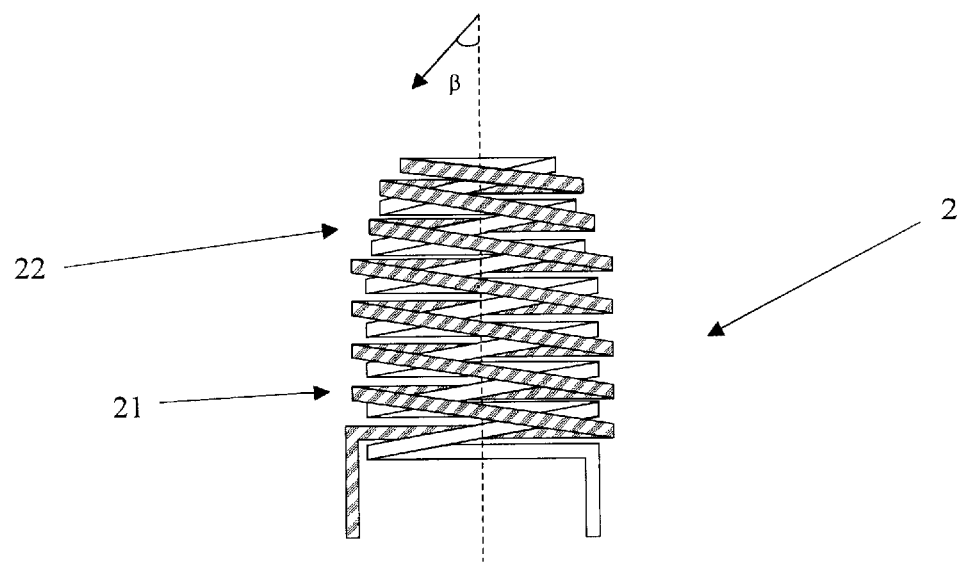
FIG. 1B is a schematic drawing showing a second preferred embodiment of the magnetic coil for use in the arc ion plating apparatus of present invention which includes a uniform-diameter section and a converging section.

FIG. 1A is a schematic drawing showing a first preferred embodiment of the magnetic coil 1 which includes a uniform-diameter section 11 and a diverging section 12. Preferably, the diverging section has an angle a between about 15 and 75 degrees, or more preferably, between about 15 and about 30 degrees, from the longitudinal axis. FIG. 1B is a schematic drawing showing a second preferred embodiment of the magnetic coil 2 which includes a uniform-diameter section 21 and a converging section 22. Again, the diverging section preferably has an angle β between about 15 and 75 degrees, or more preferably, between about 15 and about 30 degrees, from the longitudinal axis.

Figure 2:
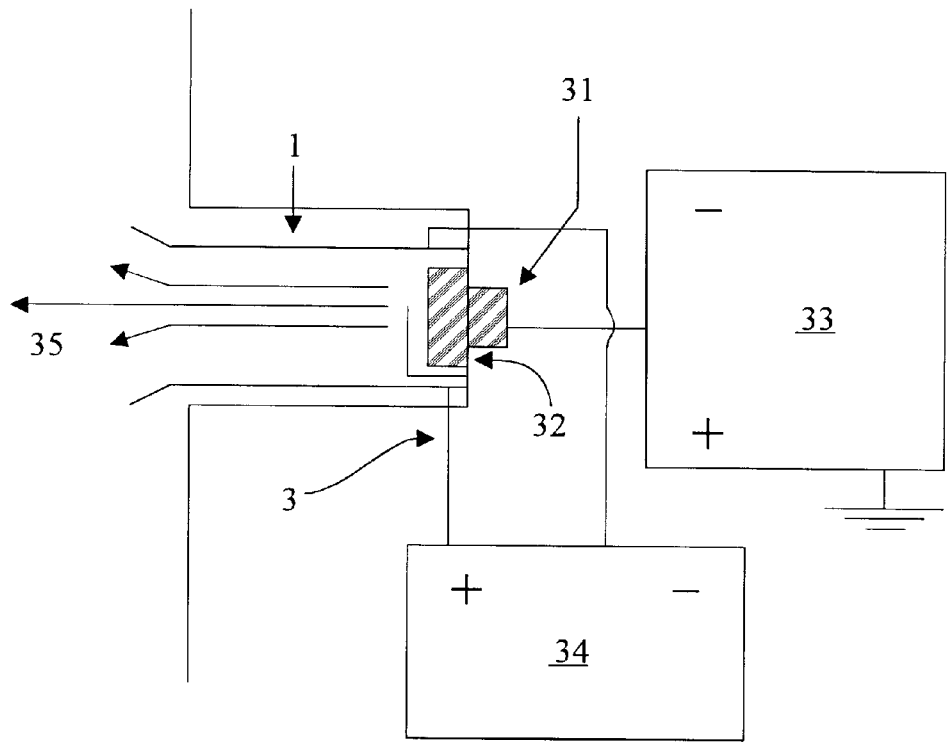
FIG. 2 is a schematic drawing showing the relationship between the magnetic coil with respect to a metal ion bombardment chamber according to the first embodiment of the present invention, wherein the magnetic coil contains a uniform-diameter section and a diverging section.

FIG. 2 is a schematic drawing showing the relationship between the magnetic coil 1 with respect to a metal ion bombardment chamber 3 according to the first embodiment of the present invention, wherein the magnetic coil contains a uniform-diameter section and a diverging section. The metal ion bombardment chamber 3 contains a metal target 31, which is connected to an arc voltage supply 33, and an arc triggering member (i.e., anode) 32. The magnetic coil 1 is connected to a magnetic field voltage supply 34. The magnetic field can be a DC-based magnetic field or an AC-based magnetic, and the magnetic field should preferably have a magnetic strength of between about 10 Gauss and 1,500 Gauss. FIG. 2 also shows diverging lines of magnetic field 35.

Figure 3:
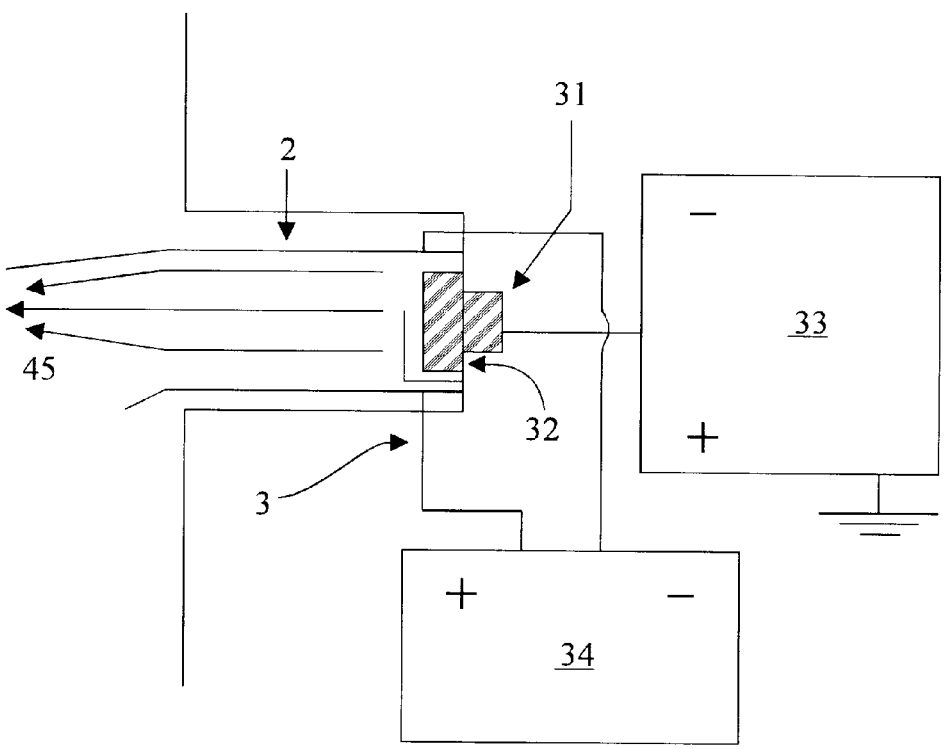
FIG. 3 is a schematic drawing showing the relationship between the magnetic coil with respect to a metal ion bombardment chamber according to the second embodiment of the present invention, wherein the magnetic coil contains a uniform-diameter section and a converging section.

FIG. 3 is a schematic drawing showing the relationship between the magnetic coil 2 with respect to a metal ion bombardment chamber 3 according to the second embodiment of the present invention, wherein the magnetic coil contains a uniform-diameter section and a converging section. Similarly, the metal ion bombardment chamber 3 contains a metal target 31, which is connected to an arc voltage supply 33, and an arc triggering member 33. The magnetic coil 2 is connected to a magnetic field voltage supply 34. FIG. 3 also shows converging lines of magnetic field 45.

Figure 4:
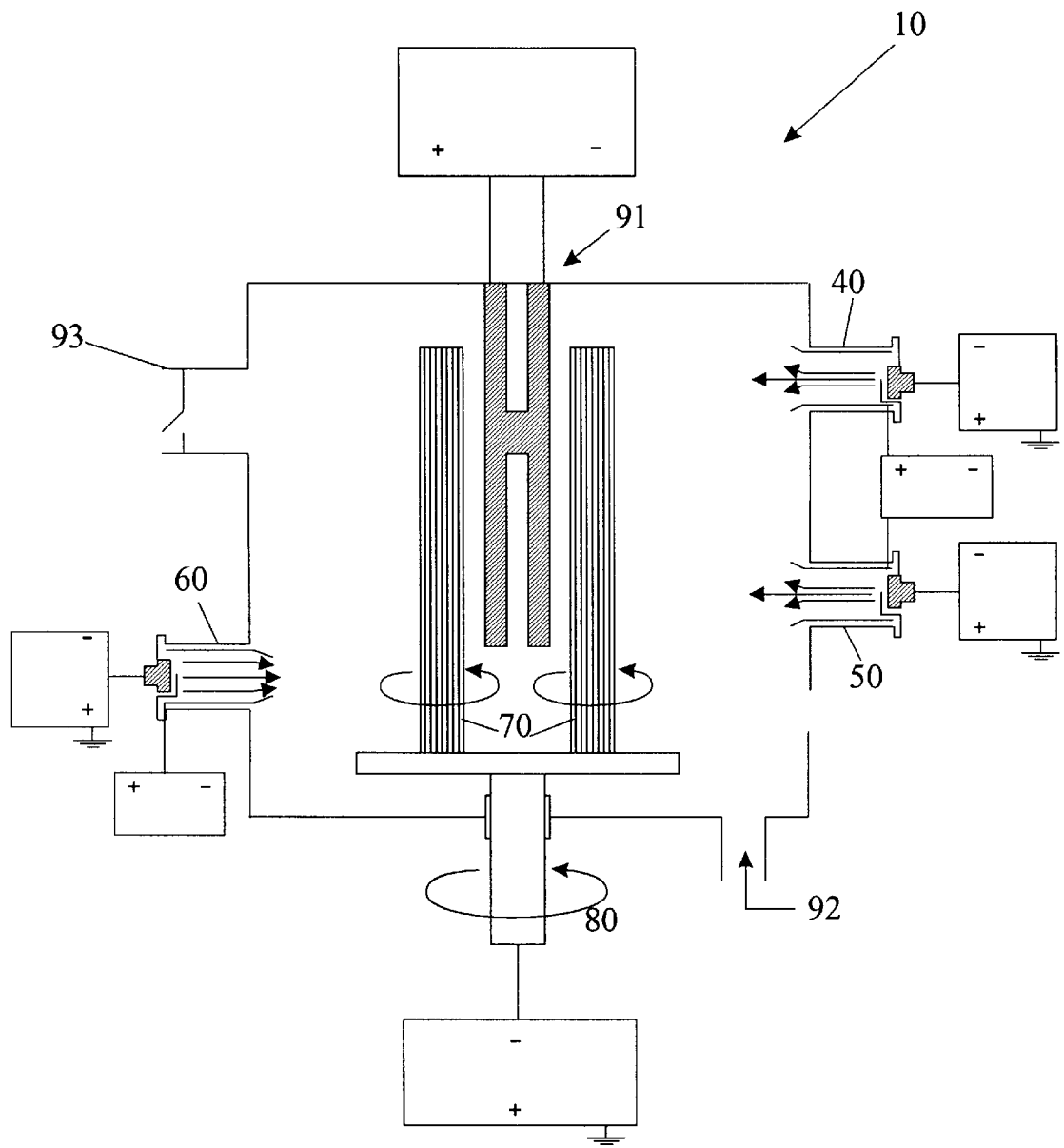
FIG. 4 is a schematic drawing of an arc ion plating apparatus which includes a pair of diverging magnetic coils and a converging magnetic coil.

FIG. 4 is a schematic drawing of an arc ion plating apparatus 10 which includes a pair of diverging magnetic coils 40, 50 and a converging magnetic coil 60. A pair of objects 70 to be plated on placed on a rotatable plateform 80. The arc ion plating apparatus 10 also contains a heating element 91, plasma gas input 92, and vacuum gate 93.

The uniform-diameter section and the converging or diverging section of the magnetic coil can be integrated. Or they can be made as separate coils that are connected together. Furthermore, the end portion can comprise a pair of diverging-then-converging or converging-then-diverging sections, or a series of diverging and converging sections. The advantage of having such a series of diverging and converging sections is to cause a turbulence in the flow of the metal ions so as to provide a more even distribution, as well as to further filter out the macro particles.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

An arc ion plating apparatus was constructed according to the first preferred embodiment described above, the diverging angle was about 20 degrees from the longitudinal axis, and a DC-based magnetic field of 50 Gauss was cause to be generated. The test object had a dimension of 5×8 cm. Test results from this Example 1 are summarized in Table 1.

COMPARATIVE EXAMPLE 1

The magnetic coil in the Comparative Example 1 was similar to that in Example 1, except that it contained only the straight magnetic coil section and did not contain the converging section. Test results from this example are summarized in Table 1.

COMPARATIVE EXAMPLE 2

The magnetic coil in the Comparative Example 2 was similar to that in Example 1, except that no magnetic coil was applied. Test results from these three examples are summarized in Table 1.

TABLE 1

| | | Example 1 | Comp. Ex. 1 | Comp. Ex. 2 |
|---|---|---|---|---|
| Film plating speed: (measured at center of the test object) | top portion | 0.045 μm/min | 0.028 μm/min | 0.006 μm/min |
| | middle portion | 0.050 μm/min | 0.060 μm/min | 0.010 μm/min |
| | bottom portion | 0.042 μm/min | 0.030 μm/min | 0.007 μm/min |
| Surface Roughness: | | <0.01 μm | <0.01 μm | ±1 μm |
| Percent of particles greater than 0.5 μm | | 0% | 0% | 1.5% |
| Homogeneity of film thickness $D_{end}/D_{center}$* | | 85% | 50% | 65% |

*$D_{end}$ is the measured film thickness at the end of the object and $D_{center}$ is the measured thickness at the center.

Table 1 shows that the use of a straight magnetic coil (Comparative Example 1) greatly improved the film plating speed relative to the traditional method (Comparative Example 2). However, it suffered from the problem of poor homogeneity ($D_{end}/D_{center}$ decreased from 65% to 50%). With the present invention, the film plating speed was increased by 400% (from 0.01 μm/min to 0.05 μm/min, measured at the middle portion), the surface roughness was reduced from ±1 μm to less than 0.01 μm, and the percent of particles greater than 0.5 μm was reduced from 1.5% to zero. The present invention exhibited substantially improved performance compared to both Comparative examples, in every category including overall film plating speed, surface roughness, percent of particles greater than 0.5 μm, and homogeneity of film thickness.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electric arc ion plating process for coating a metal material on an object using electric arc ion plating apparatus, said process comprising the steps of:
    (a) placing an object to be coated in said electric arc ion plating apparatus which comprises:
        (i) a vacuum chamber;
        (ii) an electric arc bombardment attachment connected through one wall of said vacuum chamber, said electric arc bombardment attachment comprises a cathode target whose surface is made of a metal to be coated on said object, and an arc triggering electrode; and
        (iii) a magnetic coil having a longitudinal axis, said magnetic coil being extending from said electric arc bombardment attachment and enclosing at least a part of said electric bombardment attachment, wherein said magnetic coil contains a constant-diameter section enclosing and immediately emanating from said electric arc bombardment chamber, and a varying-diameter section away from said electric arc bombardment attachment, said varying-diameter section having a diverging, converging, converging-then-diverging, or diverging-then-converging geometry and is coaxial with respect to said constant-diameter section;
        (iv) wherein said object is placed outside of said magnetic coil;
    (b) applying an electric voltage to said cathode and said arc triggering electrode so as to cause metal particles to be generated from said cathode surface; and
    (c) applying an electric current to said magnetic coil so that said constant-diameter section of said magnetic coil directs said metal particles away from said electric arc bombardment attachment and toward said object, and said varying-diameter section of said magnetic coil causes said metal particles to be diverged from or converged toward said longitudinal axis after they leave said magnetic coil.

2. The electric arc ion plating process according to claim 1 wherein said varying-diameter section comprises a diverging section having a diverging angle of between about 15 and about 75 degrees with respect to the longitudinal axis.

3. The electric arc ion plating process according to claim 1 wherein said varying-diameter section is a diverging section having a diverging angle of between about 15 and about 30 degrees with respect to the longitudinal axis.

4. The electric arc ion plating process according to claim 1 wherein said varying-diameter section is a converging section having a converging angle of between about 15 and about 75 degrees with respect to the longitudinal axis.

5. The electric arc ion plating process according to claim 1 wherein said varying-diameter section is a converging section having a converging angle of between about 15 and about 30 degrees with respect to the longitudinal axis.

6. The electric arc ion plating process according to claim 1 wherein said constant-diameter section has a length which is long enough so as to cause particles greater than a predetermined size to settle inside said magnetic coil.

7. The electric arc ion plating process according to claim 1 wherein said magnetic coil has a magnetic strength of between about 10 and 1,500 Gauss.

8. The electric arc ion plating process according to claim 1 wherein said varying-diameter section comprises at least one sequence of converging-then-diverging section.

9. The electric arc ion plating process according to claim 1 wherein said varying-diameter section comprises at least one sequence of diverging-then-converging sections.

* * * * *